United States Patent [19]
Rathunde

[11] Patent Number: 5,644,767
[45] Date of Patent: Jul. 1, 1997

[54] METHOD AND APPARATUS FOR DETERMINING AND MAINTAINING DRIVE STATUS FROM CODES WRITTEN TO DISK DRIVES OF AN ARRAYED STORAGE SUBSYSTEM

[75] Inventor: Dale F. Rathunde, Wheaton, Ill.

[73] Assignees: AT&T Global Information Solutions Company, Dayton, Ohio; Hyundai Electronics America, San Jose, Calif.; Symbios Logic Inc., Fort Collins, Colo.

[21] Appl. No.: 385,387

[22] Filed: Feb. 7, 1995

Related U.S. Application Data

[63] Continuation of Ser. No. 69,475, Jun. 1, 1993, abandoned.

[51] Int. Cl.$^6$ .................................................. G06F 11/22
[52] U.S. Cl. ................ 395/651; 395/183.12; 395/185.02
[58] Field of Search ........................ 395/182.18, 183.12, 395/185.02, 700, 800, 651

[56] References Cited

U.S. PATENT DOCUMENTS

| | | | |
|---|---|---|---|
| 4,642,760 | 2/1987 | Yanai et al. | 395/725 |
| 4,819,205 | 4/1989 | McRoberts | 371/10.2 |
| 4,885,677 | 12/1989 | Heilman et al. | 364/184 |
| 4,989,130 | 1/1991 | Moriyama et al. | 371/8.1 |
| 5,220,569 | 6/1993 | Hartness | 371/7 |
| 5,325,497 | 6/1994 | Jaffe et al. | 395/425 |
| 5,430,866 | 7/1995 | Lawrence et al. | 395/182.18 |

*Primary Examiner*—Richard L. Ellis
*Attorney, Agent, or Firm*—Daniel N. Fishman; Wayne P. Bailey; James M. Stover

[57] ABSTRACT

A method whereby a host computer system is informed of the drive status in a disk array when one or more of the disk drives fail. A data pattern (timestamp or status code) is written on each of the disk drives in service in the array when an event occurs which changes the operating state of an array. The state of an array changes only when the array is configured, unconfigured, a disk drive fails, parity is marked inconsistent or the array is restored. The timestamp includes a binary number to allow the system to determine the status of each disk drive in the array. At each state, the timestamp on each of the operating disk drives is updated to reflect the number of operating disk drives and the status of the parity data. The distinct binary numbers that result when the array changes states allow the system to maintain the data integrity of the array.

12 Claims, 3 Drawing Sheets

C – FULL CONFIGURATION
E – ERROR
P – PARTIAL CONFIGURATION
R – RESTORE COMPLETED
U – UN-CONFIGURATION

C – FULL CONFIGURATION
E – ERROR
F – FORCE CONFIGURATION
P – PARTIAL CONFIGURATION
R – RESTORE COMPLETED
U – UN – CONFIGURATION
V – VERIFY FAILED

METHOD AND APPARATUS FOR DETERMINING AND MAINTAINING DRIVE STATUS FROM CODES WRITTEN TO DISK DRIVES OF AN ARRAYED STORAGE SUBSYSTEM

This is a continuation of application Ser. No. 08/069,475 filed Jun. 1, 1993 now abandoned.

The present invention relates to disk array storage systems and, more particularly, to a method for determining the drive status in a disk array when one or more disk drives fail.

BACKGROUND OF THE INVENTION

Disk arrays comprising a multiplicity of small inexpensive disk drives, such as the 5¼ or 3½ inch disk drives currently used in personal computers and workstations, connected in parallel have emerged as a low cost alternative to the use of single large disks for non-volatile storage of information within a computer system. The disk array appears as a single large fast disk to the host system but offers improvements in performance, reliability, power consumption and scalability over a single large magnetic disk. Several disk array alternatives are discussed in an article titled "A Case for Redundant Arrays of Inexpensive Disks (RAID)" by David A. Patterson, Garth Gibson and Randy H. Katz; University of California Report No. UCB/CSD 87/391, Dec. 1987. The article, incorporated herein by reference, discusses disk arrays and the improvements in performance, reliability, power consumption and scalability that disk arrays provide in comparison to single large magnetic disks.

A disk array supporting RAID levels with redundant data must sustain a single disk failure or system fault with high reliability and availability. This means the integrity of the data blocks and parity blocks across the array must be maintained. There are several windows of vulnerability which must be protected or data integrity cannot be assured. These windows occur when there is a disk drive or system failure during I/O operations on the array.

OBJECTS OF THE INVENTION

It is therefore an object of the present invention to provide a new and useful method for assuring the integrity of a disk array.

It is another object of the present invention to provide a new and useful method for determining disk drive status in a disk array when one or more disk drives fail.

It is yet another object of the present invention to provide a new and useful method for determining disk drive and parity status in a disk array following the occurrence of an event which changes the operating state of a disk array.

It is still a further object of the present invention to provide such a method wherein distinct status codes are maintained on each drive in the array to record disk drive and parity status information.

SUMMARY OF THE INVENTION

There is provided, in accordance with the present invention, a method for informing a host computer system of the drive status in a disk array following a disk drive or system failure. The method includes the step of writing a binary status code or timestamp onto each drive in the array upon initialization of the array. A new status code is written to each drive in the array upon the occurrence of an event which changes the operating state of the disk array, such as when the array is configured, unconfigured, a disk drive fails, parity is marked inconsistent, or the array is restored. A drive or system failure will result in one or more drives not being updated with the new status code. During subsequent initializations of the array, at periodic intervals, or following the occurrence of specific events, the status codes stored on each drive are read and drives having status codes which have not been updated are identified.

In one embodiment of the invention, described below, a two bit binary status code is utilized to track drive status. During initialization of the array a binary drive status code of 00 is written to each drive within the array. The occurance of an event such as the unconfiguration of the array or a disk drive failure, causes the drive status code on each active drive to be incremented. The preferred embodiment of the present invention utilizes a three bit binary code for tracking parity status in addition to drive status.

The above and other objects, features, and advantages of the present invention will become apparent from the following description and the attached drawings.

DETAILED DESCRIPTION OF THE PREFERRED EMBODIMENT

Basic Model

Figure 1:
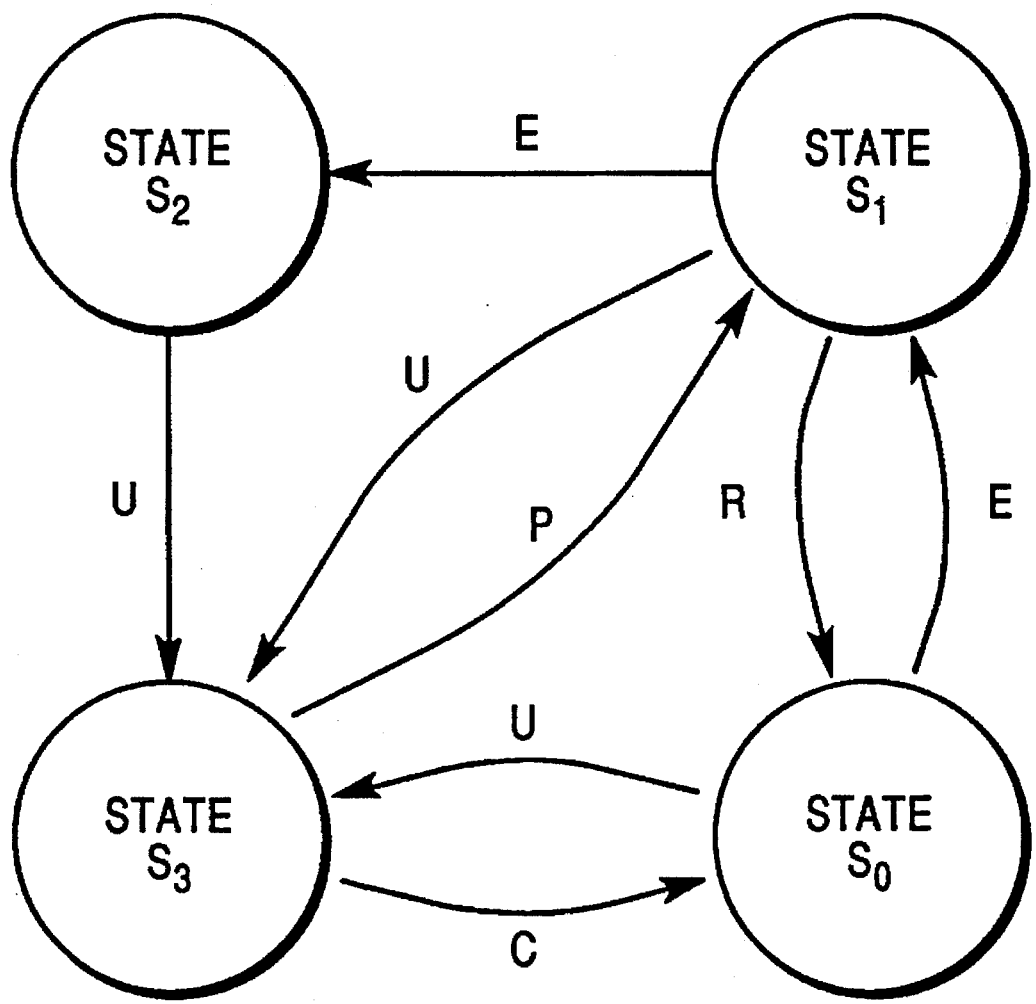
FIG. 1 is a state diagram illustrating a basic method for determining disk drive status and data integrity in a disk array in accordance with the present invention.

The method of the present invention allows a host computer system 300 to determine the drive 312, 314, and 316 in a disk array 302 when one or more disk drives 306, 308, and 310 fail, i.e., are out-of-service, in the array. This basic model for the method of the present invention is illustrated in FIG. 1 and consists of four states and a finite set of ordered pairs (transitions) that allow the disk array to change from one state to the next. At each state a timestamp on each of the operating disk drives is updated to reflect the number of disk drives out-of-service. The layout for the timestamp is shown below:

| Reserved | Parity Status | Drive Status |
|---|---|---|
| 31 | 3  2 | 1  0 |

The timestamp as shown above consists of thirty-two bits. Bits 0 and 1, identified as the drive status code, and are set to indicate drive status. Four drive status values, 0 through 3 (binary values 00 through 11), are permitted. Bit 2 is utilized to indicate parity status. Additional bits can he included in the timestamp to provide additional functionality for the environment in which the array is operating.

Referring now to FIG. 1, the states for the basic model for the method of the present invention are shown. The states for this basic reliability model are:

S0: State 0 The array is configured and all disk drives are in service,

S1: State 1 The array is configured with one disk drive out-of-service,

S2: State 2 The array is configured with two disk drives out-of-service, and

S3: State 3 The array is unconfigured and data can no longer be accessed.

The data in the disk array is accessible in states S0 and S1. For states S0, S1 and S2 the state number represents bits 1 and 2 of the timestamp value, i.e., the drive status code, recorded on each of the operating disk drives. For example, S1 represents a drive status code of 01. However, for state S3 the drive status code can have more than one value. The drive status code for state S3 is the previous state's drive status code value incremented by one. This allows the system to determine if the array was unconfigured and the system was shutdown properly.

The state of the array changes when an event occurs that forces the system to detect a transition. The following is a list of these events:

C: Full Configuration An operation to configure the array was requested with all disk drives in service, P: Partial Configuration An operation to configure the array was requested with 1 disk drive out-of-service, U: Un-configuration An operation to unconfigure the array was requested from one of the other operating states, E: Error An I/O error occurred when the array is configured.

R: Restore Completed A restore operation was requested to recreate data or generate parity data in the array.

The state diagram shown in graphical form in FIG. 1 is also shown in tabular form in table 1 below:

TABLE 1

Transition State Diagram

| | | Next State | | | |
|---|---|---|---|---|---|
| | | S0 | S1 | S2 | S3 |
| Current State | S0 | | E | | U |
| | S1 | R | | E | U |
| | S2 | | | | U |
| | S3 | C | P | | |

Table 1: State transition diagram for the basic reliability model of a disk array.

There are eight basic transitions that the system must recognize to maintain the timestamps in the array (as indicated in table 1). For example, given event E occurs while the array is in state S0 the timestamps are written on the remaining operating disk drives to complete the transition. For the transistion S0 to S1, the set of drive status codes characterizing the state of the operating disk drives in an array including three disk drives can be represented as {0,1,1}. In this case, the failed disk drive will have the previous drive status code 0 and the remaining disk drives will have the new drive status code 1.

The state diagram shown in tabular form in table 1 can now be changed as shown below in table 2 to show the set of drive status codes for each of the basic transition states in a RAID level 5 disk array including three disk drives.

TABLE 2

Basic Timestamp Model

| | | Next State | | | |
|---|---|---|---|---|---|
| | | S0 | S1 | S2 | S3 |
| Current | S0 | | {011} | | {111} |
| | S1 | {000} | | {012} | {022} |

TABLE 2-continued

Basic Timestamp Model

| | | Next State | | | |
|---|---|---|---|---|---|
| | | S0 | S1 | S2 | S3 |
| State | S2 | | | | {013} |
| | S3 | {000} | {011} | | |

Table 2: Drive Status Codes for the basic reliability model. (The failed disk drive is the first member of the set.)

In addition to the transition states shown in table 2, there is also a finite set of invalid transitions that may occur if the system fails when the array is changing states. For example, given the array in table 2, if a system fault occurred during the transition (S0, S3) after the second disk drive was updated, the drive status codes will be (1,1,0). When the system is booted and the array is configured, the drive status codes will indicate disk drive number 3 is out-of-service. If the system fault occurred after the first disk drive was updated, the drive status codes will be (1,0,0) and indicate both disk drive 2 and 3 are out-of-service. In any invalid transition case, the data integrity is assured.

Complete Model

To provide complete coverage the system must not only determine if a disk drive is out-of-service, but if parity is inconsistent (out-of-date) with the data in the array, or both. Therefore, the timestamp must include more than just the drive status information. The timestamp must also record parity status on each disk drive. For example, if an array has bad parity, data in the array cannot be accessed with one drive out-of-service.

Figure 2:
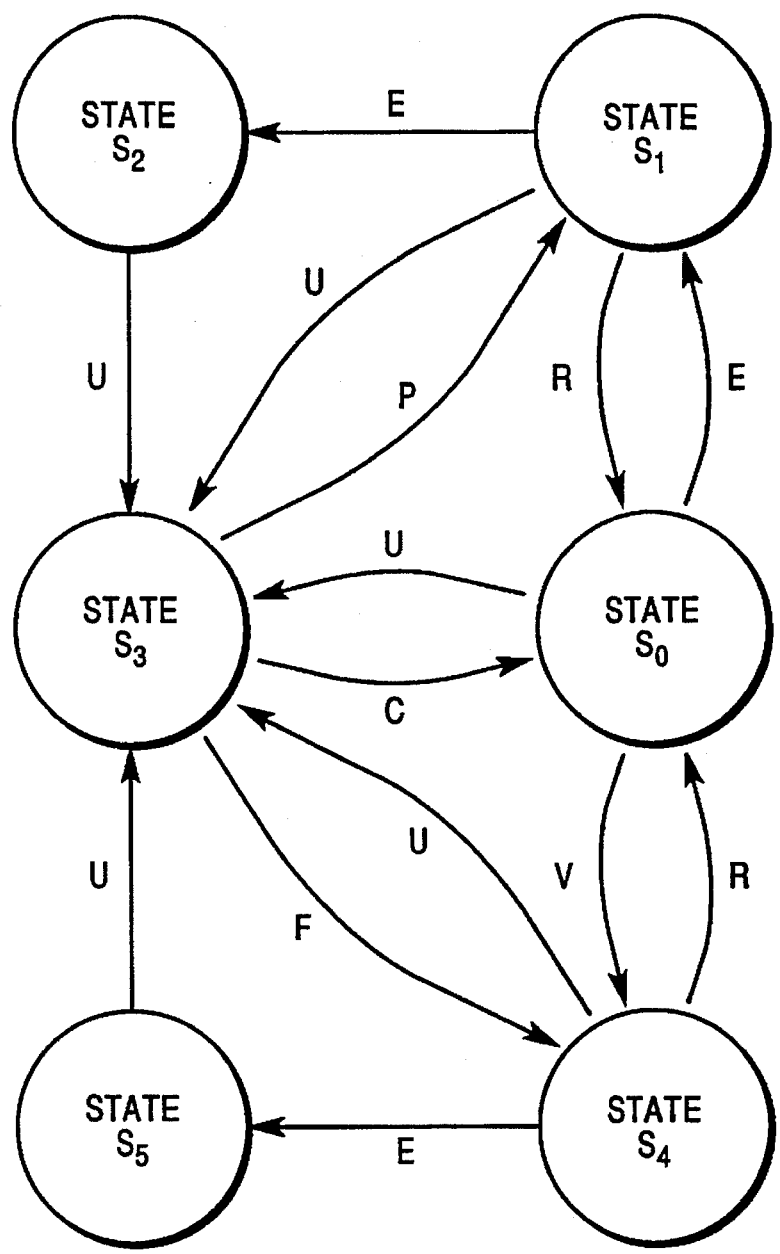
FIG. 2 is a state diagram illustrating a more evolved method for determining disk drive status and data integrity in a disk array in accordance with the present invention.
Figure 3:
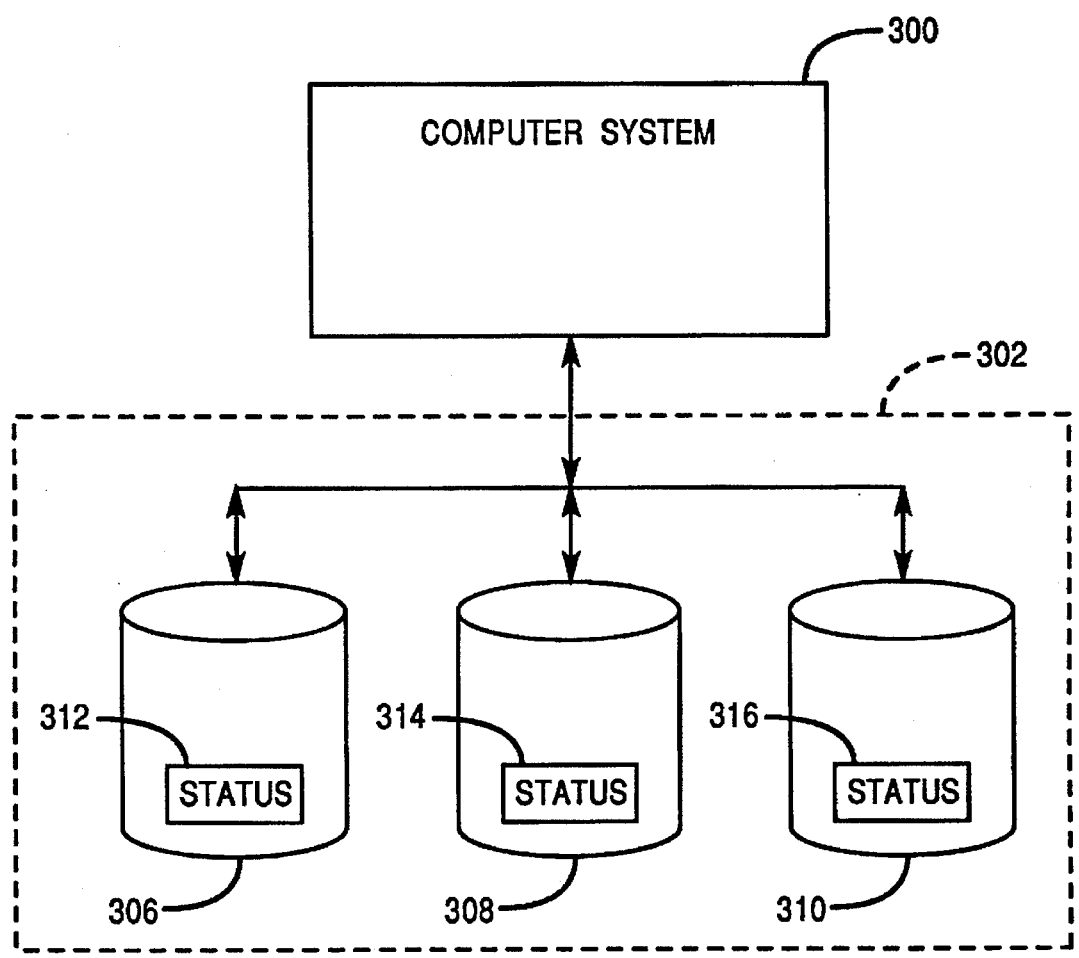
FIG. 3 shows a computer system including an array of disk drives which operates using the methods of the present invention.

The complete reliability model for a disk array is given in FIG. 2. The complete reliability model allows the system to keep track of the number of disk drives that are out-of-service and the status of parity in the array. This model consists of two additional states and two additional events. The new states for the complete reliability model are:

S4: State 4 The array is configured and all disk drives are in-service with inconsistent parity data, S5: State 5 The array is configured with 1 disk drive out-of-service with inconsistent parity data.

For states S4 and S5 the state number represents the number of operating disk drives as well as the status of the parity data. For example, in state S4 the combined drive and parity status code, consisting of bits 0 through 2 of the timestamp, has a value of 4 (or hex 4 where bit 2 represents bad parity and bits 1 and 0 represent the operating status of all disk drives). The new events for the complete reliability model are:

F: Force Configuration An operation to initialize the configuration was requested for a new array.

V: Verify Failed A verify operation was requested and found parity to be inconsistent.

Both of these new events will change the array to state S4. This is the initial state of any array when it is first configured in the system. If a disk drive fails in state S4 before the parity data is successfully restored, the array will move to state S5. In state S5, the data in the array is not accessible (same as state S2). States S2 and S5 are referred to as the "data loss" states.

The new states S4 and S5 introduce six more state transitions to complete the model. At each state, the timestamp on each of the operating disk drives is updated to reflect the parity status as well as the number of disk drives out-of-service.

The parity and drive status codes for the six new state transitions can be found in table 3 below:

TABLE 3

Complete Timestamp Model

|  |  | Next State | | | | | |
|---|---|---|---|---|---|---|---|
|  |  | S0 | S1 | S2 | S3 | S4 | S5 |
| Current State | S0 |  | {011} |  | {111} | {444} |  |
|  | S1 | {000} |  | {012} | {022} |  |  |
|  | S2 |  |  |  | {013} |  |  |
|  | S3 | {000} | {011} |  |  | {444} |  |
|  | S4 | {000} |  |  | {555} |  | {455} |
|  | S5 |  |  |  | {466} |  |  |

Table 3: Parity/Drive Status Codes for the complete reliability model. (The failed disk drive is the first member of the set.)

Hot Spare Model

The state transition diagram for a hot spare reliability model is similar to the complete reliability model. The difference between the models is the value assigned to the timestamps.

When a hot spare is configured into the array (restored), the timestamp value on the operating disk drives is updated to indicate the array is running on a spare disk. One of the unused high-order bits can be set in the timestamp in the same manner the bad parity bit was set. The new timestamp value will allow the system to support the fourteen valid transitions shown above in table 3. The spare disk information can be removed from the timestamps when the failed disk drive has been successfully replaced and restore.

Implementation

The reliability model discussed above has been implemented into a software array product manufactured by NCR Corporation titled "Disk Array PLUS". NCR Disk Array PLUS supports this reliability model through the use of an administration utility and a software array driver. The utility is invoked at system initialization and shutdown to configure and unconfigure the arrays respectively. When the system is running, the utility can be used to invoke restore and verify operations on the array. These operations send I/O control (ioctl) commands to the software driver. When the array driver completes one of these operations it calls a base-level driver routine to read and/or write the timestamps on the operating (active) disk drives. This implementation is not dependent on the location of the timestamp on the disk drive.

The following describes how the NCR Disk Array PLUS driver utilizes the timestamps for each of the fourteen valid transitions shown in table 3:

1. Transition (S3, S0) When an array is configured, the disk array driver reads the timestamps on each disk (partition) in the disk array to determine the status of each disk drive. If the timestamps indicate a valid disk array configuration from transition (S0, S3) the disk array is marked as on-line (data accessible), the disk array driver will perform a read-modify-write on all the active disk drives to update the parity and drive status code to value 0.

2. Transition (S3, S4) When an array is configured, and the timestamps indicate a new disk array configuration (two or more undefined timestamps or an invalid transition), the disk array driver will display a message to the console warning that the timestamps are not valid and the disk array will remain off-line (i.e., data cannot be accessed). The message also indicates the disk array can be brought on-line through the use of a force configuration operation. When an array configuration is forced on-line, the disk array driver will write a timestamp including ident information and parity and drive status code 4 (bad parity) to all disk drives in the array (including the spare disk drive if configured).

If the timestamps indicate that parity is out-of-date from transition (S4, S3), the array driver will perform a read-modify-write on all disk drives to update the parity and drive status code to value 4.

3. Transition (S0, S3) When an array is unconfigured from state S0, the array driver will perform a read-modify-write on all the active disk drives to update the parity and drive status code to value 1.

4. Transition (S4, S3) When an array is unconfigured with bad parity from state S4, the array driver will perform a read-modify-write on all the active disk drives to update the parity and drive status code to value 5.

5. Transition (S5, S3) When an array is unconfigured from state S5, the array driver will perform a read-modify-write on all the active disk drives to update the parity and drive status code to value 6.

6. Transition (S3, S1) When an array is configured, and the timestamps indicate that one disk drive is out-of-service (parity and drive status code of 0, invalid timestamp or an I/O error occurred while reading a timestamp), the disk array driver will display a notice message to the console stating that a disk drive is out-of-service and the disk array will be marked as on-line. The disk array driver will perform a read-modify-write on all of the active drives to update the parity and drive status codes to value 1.

7. Transition (S0, S1) When an I/O error occurs and error recovery procedures fail or the system requests to force a piece out-of-service for "hot insertion", the array driver will display a warning message to the console stating the piece has been taken out-of-service. The disk array driver will perform a read-modify-write on all of the active drives to update the parity and drive status codes to value 1.

8. Transition (S1, S3) When an array is unconfigured from state S1, the array driver will perform a read-modify-write on all the active disk drives to update the parity and drive status codes to value 2.

9. Transition (S1, S0) After an array with one piece out-of-service is restored. The disk array driver will perform a read-modify-write on all the disk drives to update the parity and drive status codes to value 0.

10. Transition (S4, S0) After an array with bad parity is restored, the disk array driver will perform a read-modify-write on all the disk drives to update the parity and drive status codes to value 0.

11. Transition (S0, S4) When a verify operation finds parity is not consistent with the data in the array the disk array driver will perform a read-modify-write on all the disk drives to update the timestamps to indicate bad parity (parity and drive status code 4).

12. Transition (S1, S2) When an I/O error occurs, the array driver will display a warning message to the console stating the piece has been taken out-of-service and the array is taken off-line. The disk array driver will perform a read-modify-write on all of the active drives to update the parity and drive status codes to value 2.

13. Transition (S4, S5) When an I/O error occurs, the array driver will display a warning message to the console stating the piece has been taken out-of-service and the array is taken off-line. The disk array driver will perform a read-modify-write on all of the active drives to update the parity and drive status codes to value 5.

14. Transition (S2, S3) When an array is unconfigured from state S2, the array driver will perform a read-modify-write on all the active disk drives to update the parity and drive status codes to value 3.

It should be noted that when the array driver attempts to configure an array, the status of the array may not always allow a transition to occur. For example, if the timestamps indicate that two disk drives are out-of-service from transition (S2, S3), the disk array driver will display a warning message to the console stating that the disk array will remain off-line. Also, if the timestamps indicate all of the disk drives are in state S0 or S1 (array on-line) when a configuration is attempted a message is displayed to the console stating that there was a system failure. Under normal shutdown conditions, the disk array driver will unconfigure the array and change to state S3.

Based on the above model, the array driver can determine if a disk array has bad parity or if a system failure occurred when the array was in state S0. During system initialization, the array driver will automatically mark parity out-of-date and perform a read-modify-write on all the active disk drives to set bad parity in the timestamps. The system will then perform an on-line restore operation to insure parity is up-to-date. In state S1, this level of reliability can only be provided by supporting a "hot spare" in the disk array.

It can thus be seen that there has been provided by the present invention a new and useful method for assuring the integrity of a disk array. The method determines disk drive and parity status in a disk array following the occurrence of an event which changes the operating state of a disk array.

Although the presently preferred embodiment of the invention has been described, it will be understood that various changes may be made within the scope of the appended claims.

What is claimed is:

1. In a computer system including an array of disk drives connected to said computer system, a method operable within said computer system for determining the status of the array drives; said method comprising the steps of:

writing a status code onto a plurality of disk drives in the array upon initialization of said array, wherein said plurality of disk drives numbers greater than two disk drives, and wherein said status code having an initial value, and wherein said status code is indicative of a number of said plurality of disk drives in an non-active state;

detecting occurrence of an event, wherein said event is one of a plurality of events including a failure of an operating disk drive, a disk array configuration operation, and a disk array restoration operation;

updating the value of said status code saved to each drive of said plurality of disk drives in the array which is in an active state upon the occurrence of said event which changes the operating state of the disk array;

reading the status codes stored on each drive of said plurality of disk drives within the array upon configuration of the array;

identifying drives within the array having status codes which have not been updated; and determining the operability of the array in accordance with the number of non-active disk drives identified in response to reading of said status codes stored on each drive.

2. The method in accordance with claim 1, wherein:

said status code comprises a binary data pattern; and said step of updating the value of said status codes comprises the step of incrementing the binary value of said status codes upon the occurrence of a disk drive failure event;

said step of updating the value of said status codes comprises the step of decrementing the binary value of said status codes upon the occurrence of a disk array configuration operation event; and said step of updating the value of said status codes comprises the step of decrementing the binary value of said status codes upon the occurrence of a disk array restoration operation event.

3. The method of claim 1 wherein said status code on each of said plurality of disk drives includes a portion indicating that said plurality of disk drives includes at least one hot spare disk drive and wherein the method further comprises the steps of:

setting said portion of said status code on said each of said plurality of disk drives in response to an event configuring said disk array to operate using said at least one hot spare disk drive; and resetting said portion of said status code on said each of said plurality of disk drives in response to an event configuring said disk array to operate without a hot spare disk drive.

4. In a computer system including an array of disk drives connected to said computer system, a method operable within said computer system for determining the status of the array; the method comprising the steps of:

detecting occurrence of an event, wherein said event is one of a plurality of events including a failure of an operating disk drive, a disk array configuration operation, and a disk array restoration operation to restore the information content of a replacement disk drive with the information content of a failed disk drive;

writing a status codes onto a plurality of disk drives in the array upon the occurrence of said event, said status code having one of a plurality of values, each value corresponding to one of said plurality of events, wherein said plurality of disk drives numbers greater than two disk drives, and wherein said status code written on ones of said plurality of disk drives in an active state is indicative of a number of said plurality of disk drives in an non-active state;

reading the status code stored on each drive of said plurality of disk drives within the disk array; and determining the status of said disk array from the status code read from each active drive of said plurality of disk drives within the disk array.

5. The method of claim 4 wherein said status code on each of said plurality of disk drives includes a portion indicating that said plurality of disk drives includes at least one hot spare disk drive and wherein the method further comprises the steps of:

setting said portion of said status code on said each of said plurality of disk drives in response to an event configuring said disk array to operate using said at least one hot spare disk drive; and resetting said portion of said status code on said each of said plurality of disk drives in response to an event configuring said disk array to operate without a hot spare disk drive.

6. In a computer system including an array of disk drives connected to said computer system, a method operable within said computer system for identifying a failed array drive; the method comprising the steps of:

writing a status code onto a plurality of disk drives in the array wherein said plurality of disk drives numbers greater than two disk drives;

incrementing each array drive status code saved to each drive of said plurality of disk drives in the array which is in an active state following the occurrence of an I/O error within the disk array, whereby the status code written to an array drive which is in a non-active state is not incremented; and reading the status codes written to each array drive of said plurality of disk drives, said array drive which is in a non-active state being identified by a status code having a value which differs from the status code value written to each array drive which is in an active state.

7. The method of claim 6 wherein said status code on each of said plurality of disk drives includes a portion indicating that said plurality of disk drives includes at least one hot spare disk drive and wherein the method further comprises the steps of:

setting said portion of said status code on said each of said plurality of disk drives in response to an event configuring said disk array to operate using said at least one hot spare disk drive; and resetting said portion of said status code on said each of said plurality of disk drives in response to an event configuring said disk array to operate without a hot spare disk drive.

8. In a computer system including an array of disk drives connected to said computer system, a method operable within said computer system for identifying disk drive failures and parity errors within said disk array; the method comprising the steps of:

writing a status code onto a plurality of disk drives in the array wherein said plurality of disk drives numbers greater than two disk drives, said status code including a first binary value associated with disk drive status and a second binary value associated with parity status;

incrementing the first binary value of each status code saved to each drive of said plurality of disk drives in the array which is in an active state following the occurrence of a disk drive I/O error within the disk array, whereby the status code written to an array drive which is in a non-active state is not incremented;

incrementing the second binary value of each status code following the occurrence of a parity error within the disk array; and reading the status codes written to each array drive of said plurality of disk drives, an array drive which is in a non-active state being identified by a status code having a first binary value which differs from the status code first binary value written to each array drive which is in an active state, and a parity error being identified by an incremented second binary value read from said array drives.

9. The method of claim 8 wherein said status code on each of said plurality of disk drives includes a portion indicating that said plurality of disk drives includes at least one hot spare disk drive and wherein the method further comprises the steps of:

setting said portion of said status code on said each of said plurality of disk drives in response to an event configuring said disk array to operate using said at least one hot spare disk drive; and resetting said portion of said status code on said each of said plurality of disk drives in response to an event configuring said disk array to operate without a hot spare disk drive.

10. In a computer system including an array of disk drives connected to said computer system, apparatus for determining the status of the array drives comprising:

storage means associated with each of said disk drives for saving a status code;

means in said computer system for writing a status code onto said storage means of a plurality of disk drives in the array upon initialization of said array wherein said plurality of disk drives numbers greater than two disk drives, said status code having an initial value, and wherein said status code is indicative of a number of said plurality of disk drives in an non-active state;

means in said computer system for detecting occurrence of an event, wherein said event is one of a plurality of events including a failure of an operating disk drive, a disk array configuration operation, and a disk array restoration operation;

means in said computer system for updating the value of said status code saved to said storage means of each of said plurality of disk drives in the array which is in an active state upon the occurrence of said event;

means in said computer system for reading the status codes stored in said storage means on each of said plurality of disk drives within the array upon configuration of the array; and means in said computer system for determining the operability of the array in accordance with the number of non-active disk drives identified in response to reading of said status codes stored in said storage means on said each of said plurality of disk drives.

11. The apparatus in accordance with claim 10, wherein:

said status code comprises a binary data pattern; and the means for updating further comprises:

means for incrementing the binary value of said status codes upon the occurrence of a disk drive failure event;

means for decrementing the binary value of said status codes upon the occurrence of a disk array configuration operation event; and means for decrementing the binary value of said status codes upon the occurrence of a disk array restoration operation event.

12. The apparatus of claim 10 wherein said status code on each of said plurality of disk drives includes a portion indicating that said plurality of disk drives includes at least one hot spare disk drive and wherein the apparatus further comprises:

means for setting said portion of said status code on said each of said plurality of disk drives in response to an event configuring said disk array to operate using said at least one hot spare disk drive; and means for resetting said portion of said status code on said each of said plurality of disk drives in response to an event configuring said disk array to operate without a hot spare disk drive.

* * * * *